(12) United States Patent
Steiner et al.

(10) Patent No.: US 8,455,815 B2
(45) Date of Patent: Jun. 4, 2013

(54) RADIO FREQUENCY VOLTAGE TEMPERATURE STABILIZATION

(75) Inventors: Urs Steiner, Branford, CT (US); Lawrence B Jones, San Jose, CA (US)

(73) Assignee: Bruker Daltonics, Inc., Billerica, MA (US)

( * ) Notice: Subject to any disclaimer, the term of this patent is extended or adjusted under 35 U.S.C. 154(b) by 12 days.

(21) Appl. No.: 13/184,278

(22) Filed: Jul. 15, 2011

(65) Prior Publication Data

US 2013/0015343 A1  Jan. 17, 2013

(51) Int. Cl.
 *H01J 49/36* (2006.01)
(52) U.S. Cl.
 USPC ......... 250/283; 250/281; 250/282; 250/336.1
(58) Field of Classification Search
 USPC ............................ 250/281, 282, 283, 336.1
 See application file for complete search history.

(56) References Cited

U.S. PATENT DOCUMENTS

| | | | |
|---|---|---|---|
| 3,818,184 A | | 6/1974 | Habfast et al. |
| 5,734,163 A | * | 3/1998 | Hayashi et al. ............... 250/292 |
| 6,424,515 B1 | | 7/2002 | Gore et al. |
| 6,730,903 B2 | * | 5/2004 | Kawato ......................... 250/292 |
| 2004/0031918 A1 | * | 2/2004 | Schoen et al. ................ 250/282 |
| 2005/0128679 A1 | | 6/2005 | Gore et al. |
| 2007/0071646 A1 | * | 3/2007 | Schoen et al. ............... 422/68.1 |
| 2009/0146810 A1 | * | 6/2009 | Monk et al. ................ 340/572.1 |
| 2010/0006439 A1 | * | 1/2010 | Ham et al. .................... 204/547 |

* cited by examiner

*Primary Examiner* — Michael Logie
(74) *Attorney, Agent, or Firm* — Robic, LLP

(57) ABSTRACT

A temperature-regulated radio frequency management system for use in a mass spectrometer is described. The temperature-regulated radio frequency management system having one or more radio frequency components disposed in a vacuum environment. The temperature-regulated radio frequency management system including a radio frequency detection circuit configured to provide feedback indicative of a radio frequency signal in one or more of the radio frequency components. In addition, the temperature-regulated radio frequency management system includes a temperature regulation circuit disposed in the vacuum environment and configured to reduce temperature-induced variations in the detection circuit.

7 Claims, 5 Drawing Sheets

RADIO FREQUENCY VOLTAGE TEMPERATURE STABILIZATION

FIELD

Embodiments of the invention relate to mass spectrometers. In particular, embodiments of the invention relate to a temperature stabilization of a voltage in a mass spectrometer.

BACKGROUND

In mass spectrometry, radio frequency ("RF") components may be used. Examples of radio frequency components used in a mass spectrometer include ion guides, mass filters, and ion traps. Such RF components may be implemented using a quadrupole configuration. Quadrupole components such as quadrupole mass filters require a temperature-stable RF voltage applied to the quadrupole. Variation in the RF voltage results in a variation from the desired operation of the quadrupole. For the example of a quadrupole mass filter, variation in the RF voltage results in a variation in mass position or mass resolution which degrades the performance of the mass spectrometer.

To stabilize an RF voltage applied to an RF component an RF voltage detector circuit is used to measure the RF voltage. The RF voltage detector circuit includes a feedback control to the RF voltage source to compensate for detected changes in the RF voltage on the RF component. As such, the stability of the RF voltage on the RF component is dependant on the stability of the RF voltage detector to ensure proper detection of changes in the RF voltage.

Such an RF voltage detector circuit or system includes a capacitor used to detect the RF voltage. The stability of the RF voltage detector depends on the ability to maintain the capacitor at a desired capacitance value. Moreover, changes in capacitance as a result of temperature variations, humidity and contamination problems also reduce stability of an RF voltage detector. For example, ceramic capacitors have a temperature drift specification of approximately 30 parts per million per degree Celsius. For this reason, as the temperature of the RF voltage detector changes, so does the capacitance of the capacitor. And, the change in capacitance affects the stability of the RF voltage detector.

Because of the high degree of stability needed in an RF voltage detector, some approaches use custom capacitor designs. These designs can include capacitor designs using air or vacuum dielectric. Typical designs include using materials such as Invar™ and ceramics with custom machining which increase the cost of such designs. In addition, these capacitors are still susceptible to changes in capacitance because of humidity and contamination. Other problems with custom capacitor designs is that the size of the capacitors are very large as required to handle the voltage standoff requirements. As such, placing these large detectors close to the RF components is problematic. The result of not having the RF voltage detector close enough to the RF components is that stray capacitances can result. These stray capacitances further degrade the stability of the RF voltage detector.

SUMMARY

A temperature-regulated radio frequency management system for use in a mass spectrometer is described. The temperature-regulated radio frequency management system having one or more radio frequency components disposed in a vacuum environment. The temperature-regulated radio frequency management system including a radio frequency detection circuit configured to provide feedback indicative of a radio frequency signal in one or more of the radio frequency components. In addition, the temperature-regulated radio frequency management system includes a temperature regulation circuit disposed in the vacuum environment and configured to reduce temperature-induced variations in the detection circuit.

Other features and advantages of embodiments of the present invention will be apparent from the accompanying drawings and from the detailed description that follows.

BRIEF DESCRIPTION OF THE DRAWINGS

Embodiments of the present invention are illustrated, by way of example and not limitation, in the figures of the accompanying drawings, in which like references indicate similar elements and in which.

DETAILED DESCRIPTION

Embodiments of a temperature-regulated radio frequency management system for use in a mass spectrometer such as a radio frequency ("RF") voltage detection system are described. In particular, a radio frequency voltage detection system is described that includes a radio frequency voltage detector including a temperature regulation system. The temperature regulation system minimizes temperature variations of the radio frequency voltage detector. In addition, embodiments of a radio frequency voltage detection system are configured such that at least a portion of the radio frequency voltage detection system resides in a vacuum chamber of a mass spectrometer. As such, embodiments of the radio frequency voltage detection system provide enhanced temperature stability, reduced exposure to humidity, and reduced exposure to contamination. Thus, less expensive components may be used for an RF voltage detection system to achieve a stable RF voltage on an RF component of a mass spectrometer.

In addition, locating at least a portion of an RF voltage detection system in a vacuum environment such as a vacuum chamber disposes the RF voltage detection system in close proximity to the RF component. This minimizes the need for long wires to connect the RF voltage detection system to the RF component, which minimizes stray capacitances that may affect the accuracy of the RF voltage detector.

Figure 1:
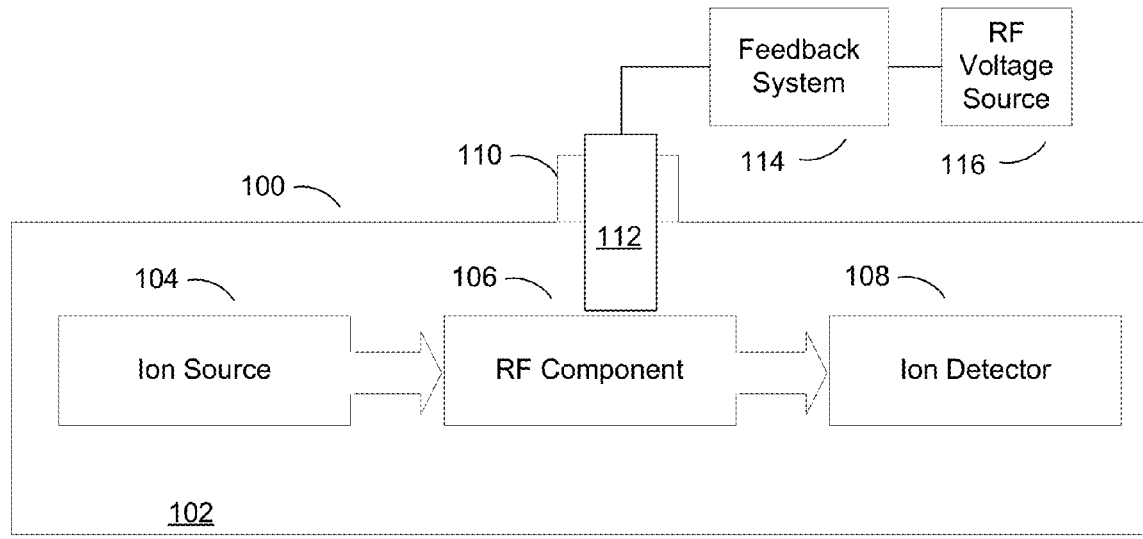
FIG. 1 illustrates a block diagram of components in a mass spectrometer including a temperature-stabilized, radio frequency voltage detection system according to an embodiment.

FIG. 1 illustrates a block diagram of a mass spectrometer including an embodiment of an RF voltage detection system 112 such as an RF voltage detection circuit. Mass spectrometer 100 includes a vacuum chamber 102 that includes the components of the mass spectrometer. The vacuum chamber 102 may be further subdivided to include regions at different pressure levels. The vacuum chamber may also include a vacuum feedthrough 110. The pressure of the vacuum chamber is controlled by one or more vacuum pumps as is known in the art.

Mass spectrometer 100 includes an ion source 104. The ion source 104 may be an electron ionization source, a chemical ionization source, supersonic molecular beam source, atmospheric pressure ionization source, or other source for creating ions of a sample for analysis. The ion source 104 ionizes the sample molecules desired to be analyzed. The ions then exit the ion source 104 and enter RF component 106. For an embodiment, RF component 106 may be an ion guide, a mass filter, ion trap, or other RF component for use in a mass spectrometer. RF component 106, for an embodiment, may be a multipole device such as a quadrupole, hexapole, octopole or other higher-order pole device.

For an RF component configured as an ion guide, an RF voltage source having an amplitude and a frequency is applied to the RF component to generate one or more electromagnetic fields used to guide the ions from the entrance to the exit of the RF component, as is known in the art. The electromagnetic field of the ion guide acts on the ions to contain the ions around a center axis. For some RF components configured as an ion guide, the RF components may further be used as a collision cell.

An RF component configured as a mass filter is used to select a portion of ions entering the RF component that have a certain m/z ratio or range of m/z ratios, as is known in the art. As such, the RF component configured as a mass filter typically has an RF voltage source with a DC component (or a separate DC source) applied to the RF component. The electromagnetic field generated by the RF component provides the force to guide the ions that have the determined m/z ratio through the RF component. The DC component acts to force other ions out (away from the central axis) of the RF component.

In the case of an ion trap, the RF component may use an RF voltage source with a DC component configured to trap ions having a particular m/z ratio or range of m/z ratios within the RF component, as is know in the art. Non-limiting examples of an ion trap include a Penning trap, Kingdon trap, Orbitrap, a linear ion trap, cylindrical ion trap, or other ion trap known in the art. For an example, the ion trap is used to store ions for subsequent experiments and/or analysis, as is known in the art.

As further illustrated in FIG. 1, ions flow from RF component 106 to ion detector 108. Ion detector 108 may be an ion detector as known in the art. For an exemplary ion detector 108, the ions transmitted from RF component 106 are measured. The ion detector 108, for example, may measure the charge induced or current produced when an ion passes by or hits a surface of the detector. The ion detector 108 may be, but is not limited to, an electron multiplier, a Faraday cup, an ion-to-photon detector, micro-channel plate or other type of ion detector.

The stability of the RF voltage applied to an RF component 106 affects the quality of the measurement of the mass spectrometer. For example, a variation in the RF voltage results in a shift in the mass position or the mass resolution of the RF component 106. As such, an RF voltage detector system 112 is used to enhance the stability of the RF voltage applied to the RF component 106.

For some embodiments, RF voltage detector system 112 is coupled with a feedback system 114, as is know in the art. According to an embodiment, the RF voltage detector system 112 provides a signal corresponding to the measured or sensed RF voltage to a feedback system 114. The feedback system 114 operates to adjust the RF voltage applied to the RF component responsive to the signal from the RF voltage detection system 112. According to an embodiment, the feedback system 114 causes the magnitude of the RF voltage generated by an RF voltage source 116 to be adjusted.

Figure 2:
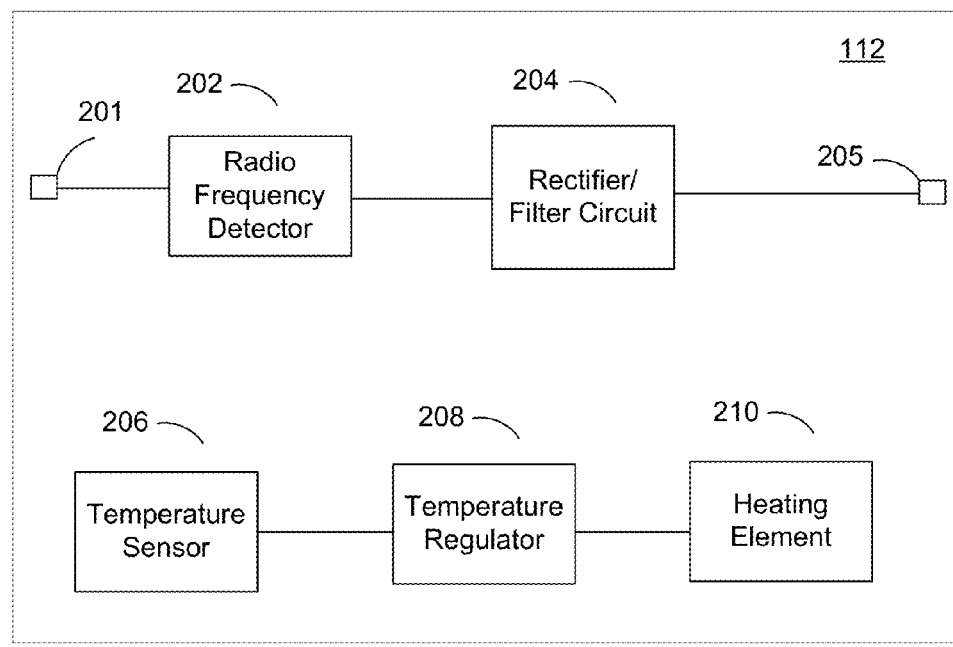
FIG. 2 illustrates an block diagram of a radio frequency voltage detection system according to an embodiment.

FIG. 2 illustrates a block diagram of an RF voltage detection system 112 according to an embodiment. The RF voltage detection system 112 according to the embodiment illustrated in FIG. 2 includes an input connector 201. The input connector is coupled with an RF component such as RF component 106 (FIG. 1), which may be a mass filter, and with radio frequency voltage detector 202. Radio frequency voltage detector 202 senses or measures the magnitude of an RF voltage applied to the RF component. Radio frequency voltage detector 202 for an embodiment is coupled with a rectifier/filtering circuit 204.

The rectifier/filter circuit 204 includes a rectifier to convert the RF voltage measured by radio frequency voltage detector 202 into a direct current ("DC") voltage using rectification techniques as is known in the art. As such, a DC voltage that is proportional to the measured RF voltage of the RF component is generated. In addition, the rectifier/filter circuit 204 may also include a filter (not shown) to condition the DC voltage to minimize ripple in the output signal as is known in the art. Rectifier/filter circuit 204 may be a full-wave rectifier to generate a rectified signal corresponding to the detected signal, such as a DC voltage corresponding to the measured RF voltage of the RF component. The filter may be a low-pass filter to minimize the high frequency components of the rectified signal. The rectifier/filter circuit 204 is coupled with an output connector 205.

For an embodiment, the output connector 205 may be coupled with a feedback system or voltage control circuitry to change the RF voltage applied to the RF component responsive to the DC voltage from the rectifier/filter circuit 204. For example, if the DC voltage generated by the rectifier/filter circuit indicates the RF voltage level is lower than it should be, the feedback system or voltage control circuitry can increase the amplitude of the RF voltage by adjusting the RF voltage source (not shown) until the DC voltage from the rectifier/filter indicates the RF voltage is at the correct level. Alternatively, the feedback system or voltage control circuitry will decrease the amplitude of the RF voltage when the DC voltage indicates the RF voltage is higher than desired level.

In addition, the embodiment of an RF voltage detection system 112 illustrated in FIG. 2 includes a temperature sensor 206. Temperature sensor 206 measures the temperature of the RF voltage detection system 112, as is known in the art. For example, the temperature sensor 206 may measure the temperature of a board including the RF voltage detection system 112. For an embodiment, temperature sensor 206 may be an integrated circuit including circuitry to measure the temperature and to generate an output signal proportional to the measured temperature. The temperature sensor 206 of the embodiment illustrated in FIG. 2 is coupled with a temperature regulator 208. The temperature regulator receives a signal that corresponds to the measured temperature, such as a voltage or current signal proportional to the temperature measured.

The temperature regulator 208, for an embodiment, generates an output signal corresponding to the measured temperature signal from the temperature sensor 206. The temperature regulator 208 may be set to maintain a board that the RF voltage detector circuit is mounted to at a predetermined temperature. According to an embodiment, a reference voltage may be used to configure the temperature regulator to maintain the RF voltage detector system 112 at a predetermined temperature. According to an embodiment, the output signal generated by the temperature regulator is a current signal to drive a heating element 210. As the magnitude of the current signal increases, the heat generated by the heating element increases, according to an embodiment. For such an embodiment, the heating element may be one or more transistors used to generate heat. However, other heating elements may be used. Together the temperature sensor 206, temperature regulator 208, and the heating element 210 operate as a temperature regulation system to maintain an RF voltage detection circuit at a desired temperature, according to an embodiment.

Figure 3:
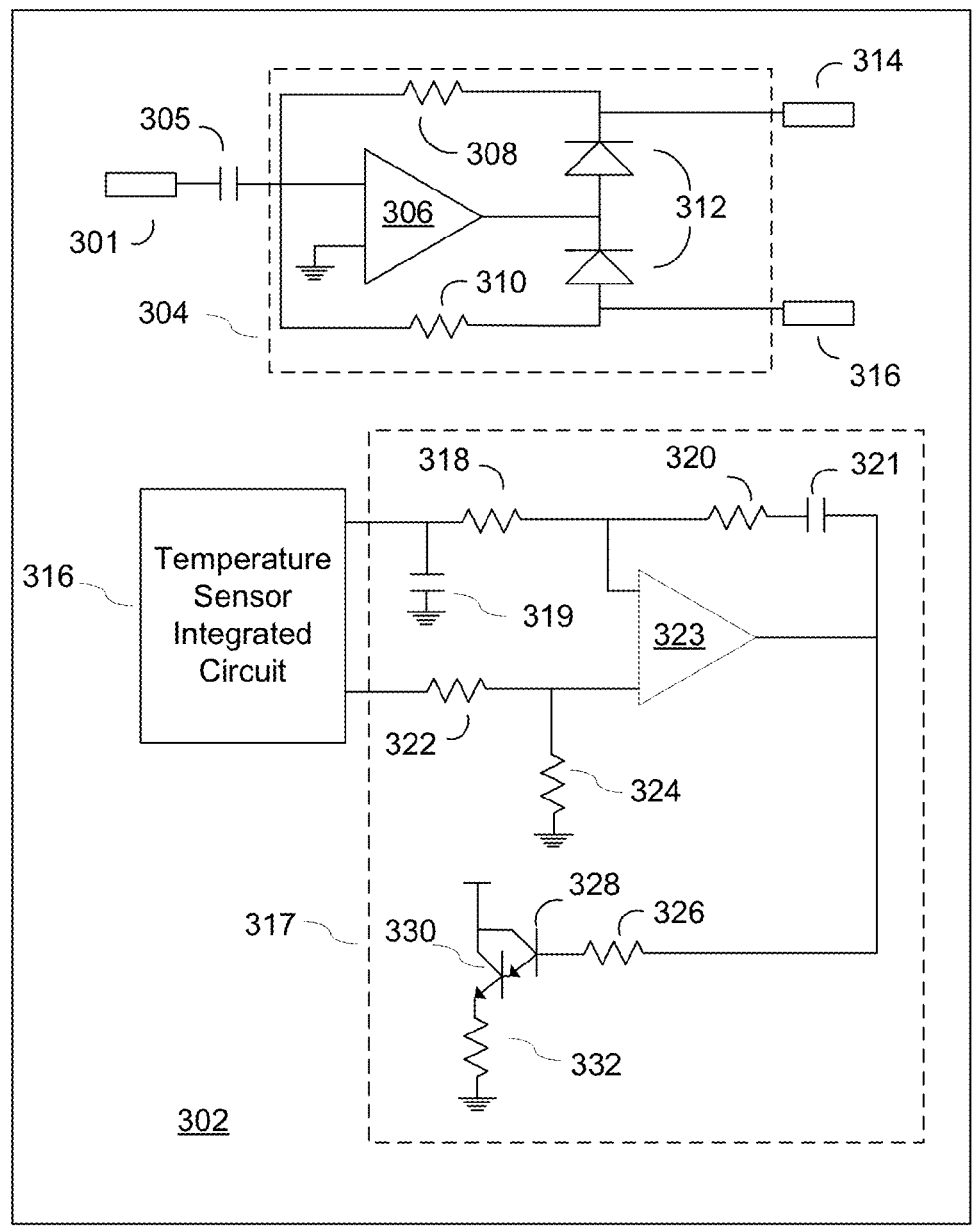
FIG. 3 illustrates a board including a radio frequency voltage detection circuit on a board according to an embodiment.

The embodiment illustrated in FIG. 3 includes examples of components used to implement a radio frequency voltage detection circuit. Specifically, FIG. 3 illustrates a board 302 including a radio frequency voltage detection circuit according to an embodiment that operates as an RF voltage detection system 112. The board 302 may be any board or assembly known in the art for mounting components such as a printed-circuit board. For some embodiments, board 302 may include more than one layer for mounting components. Moreover, board 302 may have one or more layers for routing signal paths between components, according to an embodiment. Some embodiments include a conductive layer coupled with a heating element to generate a heat flow on the conductive layer. The conductive layer provides a way to help stabilize the temperature of the RF voltage detection circuit.

In addition, board 302, according to an embodiment is configured such that at least a portion of the board 302 resides within a vacuum feedthrough. For an alternative embodiment, the board 302 is configured to reside completely within the vacuum feedthrough. Having a board 302 configured to reside within a vacuum feedthrough provides isolation from contamination and humidity that can degrade the performance of an RF voltage detection circuit. In addition, locating the board 302 inside a vacuum feedthrough, according to an embodiment, provides the connection of the RF voltage detection circuit either directly to an RF component or adjacent to an RF component.

Locating the board 302 in close proximity to an RF component minimizes the need for long wires that may add stray capacitances to the RF voltage detector circuit that would degrade the stability of the measurement. For embodiments, board 302 may be configured to reside in a vacuum feedthrough mounted to a vacuum chamber or a manifold coupled with the vacuum chamber that is temperature regulated to enhance the stability of the RF voltage detector circuit. For such an embodiment the vacuum manifold may be regulated to maintain a temperature to within four degrees. For another embodiment, the vacuum manifold may be regulated to maintain a temperature to within one degree. According to another embodiment the vacuum manifold temperature is maintained to approximately fifty-four degrees Celsius. Thus, for an embodiment the vacuum manifold, vacuum feedthrough, and RF voltage detector circuit operate as a system to enhance the stability of the RF voltage of an RF component.

Referring back to FIG. 3, input connector 301 on board 302 may be used to connect radio frequency detector 305 to an RF component. For an embodiment input connector 301 may be configured to contact directly to an RF component, such as input connector 301 being in direct contact with a metal rod of a multipole device. Other embodiments 301 may include input connector 301 coupled with a mating connector located near an RF component and coupled with the RF component.

According to the embodiment illustrated in FIG. 3, the radio frequency detector 305 is implemented as a capacitor. According to an embodiment, radio frequency detector 302 is a capacitor having a capacitance of less than 100 picofarads. For other embodiments, the radio frequency detector 305 is a capacitor having a capacitance of approximately 1 picofarad. For yet another embodiment, the radio frequency detector 302 is a capacitor having a capacitance of less than 1 picofarad. As is know in the art, the appropriate value of the capacitor depends on the magnitude of the RF voltage to be measured. For some embodiments, radio frequency detector 305 is configured to measure RF voltages one or more kilovolts. For measuring RF voltages in the kilovolt range the capacitor value would be 1 picofarad or less, according to an embodiment. For a specific embodiment, RF detector is configured to sense an RF voltage having an amplitude of approximately 3000 kilovolts.

For some embodiments, the radio frequency detector 305 may use a capacitor having a temperature coefficient rating of greater than or equal to 30 parts per million/degree Celsius. The temperature regulation of the board 302 provides the ability to use capacitors having a higher temperature coefficient rating without affecting the stability of the RF voltage detector circuit.

Moreover, the embodiment illustrated in FIG. 3 includes a rectifier/filter circuit 304 coupled with RF detector 305. For such an embodiment, the rectifier/filter circuit 304 receives the detect signal from RF detector 305 and generates a DC voltage, as discussed above. To generate a DC voltage corresponding to the detect signal from RF detector 305, the rectifier/filter circuit 304 is implemented using components including an operational amplifier 306, resistors 308 and 310, and diodes 312.

The embodiment of rectifier/filter circuit 304 may be implemented using various other component configurations to generate a DC voltage signal, as one skilled in the art would understand how to do in view of this disclosure using techniques known in the art. Such configurations may include one or more of operational amplifiers, resistors, diodes or other components to generate a DC voltage corresponding to the detect signal from RF detector 305. The DC voltage is then present across output connectors 314 and 316 of the rectifier/filter circuit 304, according to an embodiment. Output connectors 314 and 316, for an embodiment, may be coupled to a feedback system or voltage control circuitry as discussed above.

Board 302 also includes a temperature sensor integrated circuit 316 as a temperature sensor 206, according to the embodiment illustrated in FIG. 3. Such a temperature sensor integrated circuit 316 may be configured to generate a voltage or a current signal corresponding to the change in the measured temperature. Other embodiments include using other components as know in the art to measure the temperature or change in temperature such as a thermistor, silicon bandgap temperature sensor, or other components that generate an output corresponding to a temperature alone or in combination with other components as is readily known by one skilled in the art.

FIG. 3 illustrates temperature sensor integrated circuit 316 coupled with a temperature regulator 317. According to the embodiment illustrated in FIG. 3, the temperature regulator 317 includes an operational amplifier 323 configured to generate a current corresponding to the signal from temperature sensor integrated circuit 316. The configuration of operational amplifier 323 includes components such as resistors 322 and 324 to set a reference voltage to set a predetermined temperature that the temperature regulator 317 will act to maintain. The other components coupled with operational amplifier 323 including resistor 318, capacitor 319 to condition the signal from temperature sensor integrated circuit 316 as an input to operational amplifier 323. Resistor 320 and capacitor 321 control how quickly operational amplifier 323 reacts to changes in a signal received from temperature sensor integrated circuit 316. One skilled in the art would have the knowledge to determine the values of the components as necessary to operate with a specific signal generated by an embodiment of a temperature sensor integrated circuit 316. One skilled in the art would also understand that various other circuit designs can be made to generate a signal for a heating element corresponding to a signal received from a temperature sensor.

Other components of the temperature regulator 317, according to the embodiment illustrated in the FIG. 3 embodiment, include transistors 328 and 330. According to an embodiment, transistors 328 and 330 are bipolar-junction transistors configured to generate heat to maintain the temperature of board 302 at a predetermined temperature. One skilled in the art would understand that other components in combination or alone such as MOSFETs, resistors, or other heating elements which convert electricity into heat could be used.

Resistor 326 is coupled to the base of transistor 328 and resistor 332 is coupled to the emitter of transistor 330, according to the embodiment illustrated in FIG. 3. Resistor 326 and 332 are used to bias transistors 328 and 330 for an operational state to generate heat upon receiving the signal from the operational amplifier 323. FIG. 3 further illustrates the collectors of transistors 328 and 330 coupled with a power supply. For a particular embodiment, the power supply is a source that generates a positive 24 volts.

For an embodiment, operation amplifier 323 increases a current signal that results in transistors 328 and 330 increasing the amount of heat produced or generated by transistors 328 and 330. Moreover, as the magnitude of the current signal from operational amplifier 323 decreases, the amount of heat produced or generated by transistors 328 and 330 decreases. As such, the components of temperature regulator 317 operate to generate a heat flow responsive to the output of a temperature sensor. One skilled in the art would appreciate that other components could be substituted for those described to generate heat describe for the embodiments herein. FIG. 3 omits connections to power supplies for active devices such as temperature sensor integrated circuit 316 and operational amplifiers 306 and 323. However, one skilled in the art would understand power and ground connections would be necessary and is standard practice in the art.

Figure 4:
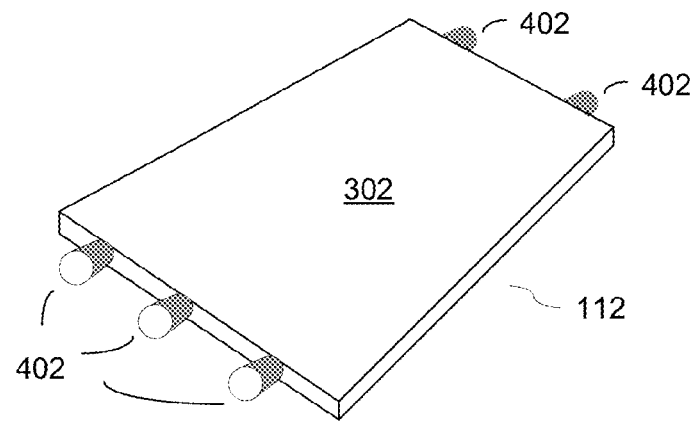
FIG. 4 illustrates a board including a radio frequency voltage detection system according to an embodiment.

FIG. 4 illustrates an embodiment of a board 302 configured to fit at least a portion of the board 302 inside a vacuum feedthrough of a vacuum chamber. As such, at least a portion of board 302 can reside inside the vacuum feedthrough. Positioned on board 302 are embodiments of a radio frequency detector 202, a rectifier/filter circuit 204, a temperature sensor 206, a temperature regulator 208, and heating element 210 as described above. According to an embodiment, components as described above may be soldered or otherwise mounted on board 302, as is known in the art. Board 302 may be any type of assembly for mounting or containing components that achieve the functions of an RF voltage detection system 112 as described herein. The embodiment illustrated in FIG. 4 also included connectors 402 mounted or otherwise attached to board 302. The connectors 402 can be used to couple the RF voltage detector system 112 with one or more of an RF components, ground, power source, voltage control circuitry, feedback system to control an RF voltage source or other components, systems or circuitry. For an embodiment, at least one connector 402 is configured to couple directly with an RF component. According to an embodiment, connectors 402 are contact pins known as "pogo" pins that are resiliently biased against corresponding contact pads (not shown) for making contact therewith.

Figure 5:
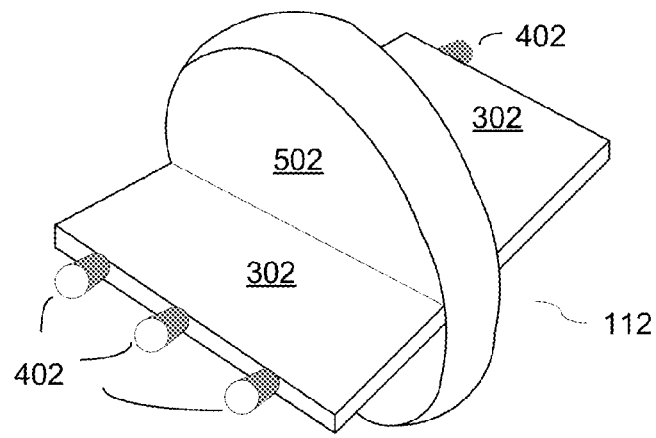
FIG. 5 illustrates a board with a mold including a radio frequency voltage detection circuit according to an embodiment.

FIG. 5 illustrates an embodiment of an RF voltage detection system 112 including a mold 502. For an embodiment, the mold may be an epoxy formed around the board 302. Any material may be used to form a mold around board 302 which minimizes air flow when board 302 is fit inside a vacuum feedthrough. The mold, for some embodiments, is formed from insulation material. The mold 502, according to an embodiment, covers some components on the board 302 such as integrated circuits, resistors, sensors, capacitors, or other components used to implement the RF voltage detection system 112.

Figure 6:
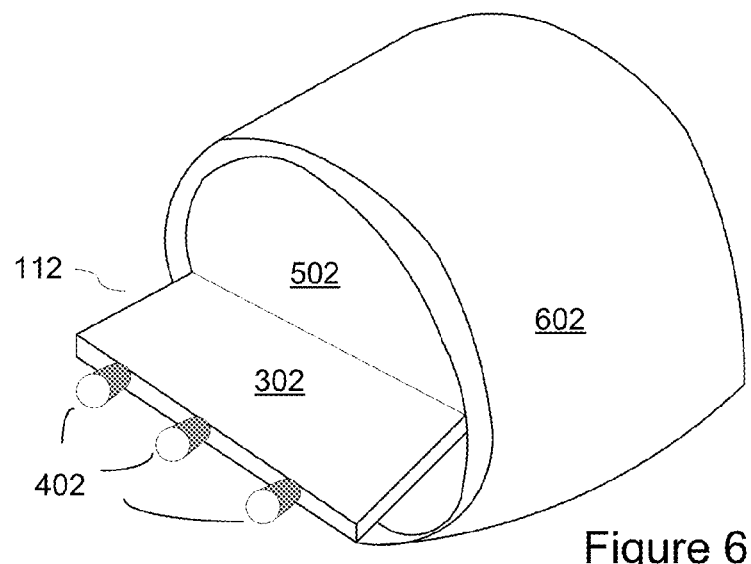
FIG. 6 illustrates a board including a radio frequency voltage detection circuit in a vacuum feedthrough according to an embodiment.

FIG. 6 illustrates a board 302 including a mold 502 covering at least a portion of the board 302 residing in a vacuum feedthrough 602 of a vacuum system of a mass spectrometer, according to an embodiment. The vacuum feedthrough 602, according to an embodiment, may be located in the vacuum system to provide access of the RF voltage detection system 112 in close proximity to an RF component in the vacuum for measuring the magnitude of the RF voltage applied to the RF component.

Figure 7:
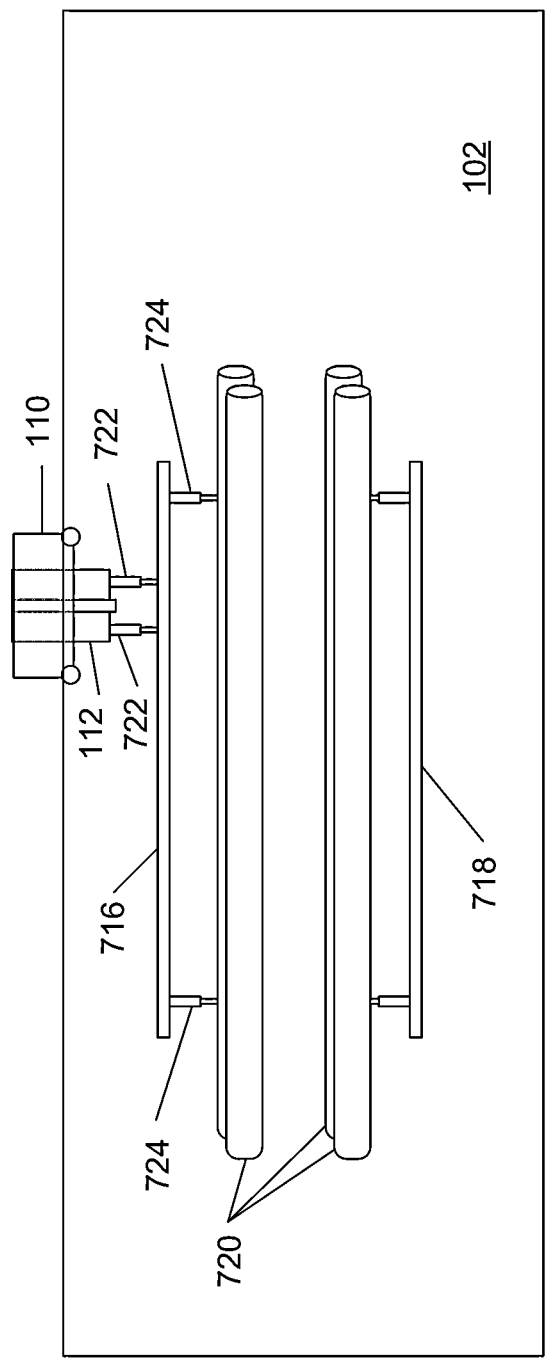
FIG. 7 illustrates a diagram of an arrangement coupling an embodiment of an radio frequency detection system with a quadrupole mass filter.

FIG. 7 illustrates a diagram of an arrangement coupling an RF voltage detection system 112 with a quadrupole mass filter according to an embodiment. The RF voltage detection system 112 is coupled with rods 720 of the quadrupole mass filter through at least one of boards 716 (upper board) and 718 (lower board). According to an embodiment, RF voltage detection system 112 is connected to the upper board 716 by way of contact pins 722. Contact pins 722, for example, may be spring-loaded and have a prescribed amount of travel and axial bias in order to maintain contact with corresponding pads (not shown) provided on board 716 and 718. The prescribed amount of travel and axial bias provide the contacts pins to establish an electrical connection with the boards 716 and 718 without exerting distorting pressure. In addition, contact pins 724 are used to couple upper board 716 with rods 720. For an embodiment, contact pins 724 are similar to contact pins 722 described above. With respect to biasing of the pins against rods 720, deformation of the rods is a factor that should be minimized because of its impact on the magnetic and electric behavior of the fields established during operation.

For mass spectrometers using a multipole RF component as discussed above, more than one RF voltage detection systems 112 may be used. For example, an RF voltage detection system 112 may be used to measure or sense the RF voltage for each phase of RF voltage applied to an RF component. For a mass spectrometer using a quadrupole mass filter, the quadrupole includes two rod pairs in such an example. Each rod pair, according to some implementations, has an RF voltage of similar magnitude applied to each rod pair. The phase of the RF voltage applied to the first rod pair is different from the second rod pair, as is known in the art. As such, one RF voltage detection system 112 may be used to measure the RF voltage applied to the first rod pair and a second RF voltage detection system 112 is used to measure the RF voltage applied to the second rod pair.

Figure 8:
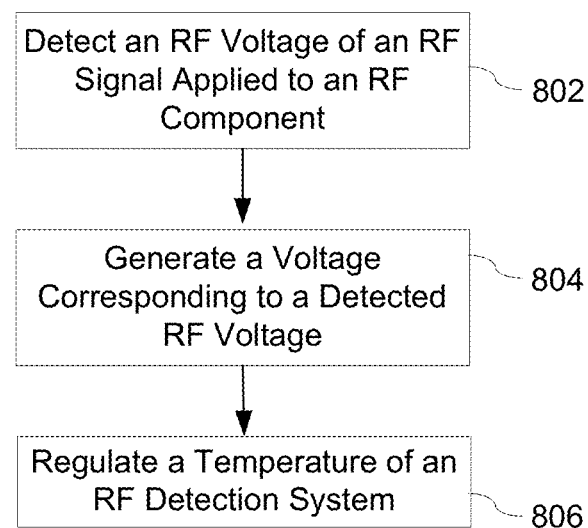
FIG. 8 illustrates a flow diagram of a process to detect an radio frequency voltage of an radio frequency component according to an embodiment.

FIG. 8 illustrates a flow diagram for a process to detect an RF voltage of an RF component of a mass spectrometer according to an embodiment. The process includes detecting an RF voltage of an RF signal applied to an RF component 802 using techniques discussed above. The RF signal includes the RF voltage applied to the RF component by an RF voltage source. Next, the process generates a voltage corresponding to a detected RF voltage 804 by using techniques described above. In addition, the process includes regulating a temperature of an RF detection system 806 using techniques described above.

In the foregoing specification, specific exemplary embodiments of the invention have been described. It will, however, be evident that various modifications and changes may be made thereto. The specification and drawings are, accordingly, to be regarded in an illustrative rather than in a restrictive manner. Other embodiments will readily suggest themselves to a person skilled in the art having the benefit of this disclosure.

What is claimed is:

1. A radio frequency voltage detection system for a mass spectrometer, said radio frequency voltage detection system comprising:
   a board configured to fit at least a portion of said board inside a vacuum feedthrough of a vacuum chamber of said mass spectrometer;
   a radio frequency detector positioned on said board, said radio frequency detector configured to generate a detect signal upon detection of a radio frequency signal;
   a rectifier positioned on said board, said rectifier coupled with said radio frequency detector, said rectifier configured to generate a rectified signal corresponding to said detect signal;
   a heating element positioned on said board, configured to generate a heat flow; and
   a temperature regulator coupled with said heating element, said temperature regulator configured to measure a temperature of said board and configured to adjust said heat flow generated by said heating element to maintain a predetermined temperature.

2. The radio frequency voltage detection system of claim 1 further comprising a mold formed around a portion of said board.

3. The radio frequency voltage detection system of claim 2, wherein said mold formed around a portion of said board is configured to fit inside said vacuum feed through.

4. The radio frequency voltage detection system of claim 1, wherein said radio frequency detector is a capacitor.

5. The radio frequency voltage detection system of claim 4, wherein said capacitor is a ceramic capacitor.

6. The radio frequency voltage detection system of claim 1, wherein said board includes a metal layer and said heating element is configured to generate said heat flow in said metal layer .

7. The radio frequency voltage detection system of claim 1 is configured to provide a feedback signal corresponding to said radio frequency voltage to a feedback system for maintaining said radio frequency voltage at a predetermined voltage.

* * * * *